United States Patent [19]

Yamazaki et al.

[11] Patent Number: 5,192,995

[45] Date of Patent: * Mar. 9, 1993

[54] ELECTRIC DEVICE UTILIZING ANTI-OXIDATION FILM BETWEEN BASE PAD FOR SEMICONDUCTOR CHIP AND ORGANIC ENCAPSULATING MATERIAL

[75] Inventors: Shunepi Yamazaki, Tokyo; Kazuo Urata, Atsugi; Itaru Koyama, Hatano; Naoki Hirose, Atsugi, all of Japan

[73] Assignee: Semiconductor Energy Laboratory Co., Ltd., Kanagawa, Japan

[*] Notice: The portion of the term of this patent subsequent to Oct. 15, 2008 has been disclaimed.

[21] Appl. No.: 655,032

[22] Filed: Feb. 14, 1991

Related U.S. Application Data

[63] Continuation of Ser. No. 392,581, Aug. 11, 1989, abandoned.

[30] Foreign Application Priority Data

Aug. 26, 1988 [JP] Japan .................... 63-212886

[51] Int. Cl.$^5$ .............. H01L 23/48; H01L 29/44; H01L 29/52; H01L 29/60
[52] U.S. Cl. .................... 257/787; 174/52.2; 174/52.4; 257/666; 257/790
[58] Field of Search ............ 357/70, 72, 74, 80; 174/52.2, 52.4

[56] References Cited

U.S. PATENT DOCUMENTS

| | | | |
|---|---|---|---|
| 4,001,872 | 1/1977 | Khajezadeh | 357/54 |
| 4,707,724 | 11/1987 | Suzuki et al. | 357/71 |
| 4,710,796 | 12/1987 | Ikeya et al. | 357/72 |
| 5,013,688 | 5/1991 | Yamazaki et al. | 437/210 |
| 5,057,900 | 10/1991 | Yamazaki et al. | 357/70 |

FOREIGN PATENT DOCUMENTS

| | | | |
|---|---|---|---|
| 0021850 | 2/1983 | Japan | 357/72 |
| 0283855 | 11/1989 | Japan | 357/72 |
| 0106953 | 4/1990 | Japan | 357/72 |

Primary Examiner—Rolf Hille
Assistant Examiner—David Ostrowski
Attorney, Agent, or Firm—Sixbey, Friedman, Leedom & Ferguson

[57] ABSTRACT

An improved electric device and manufacturing method for the same are described. The device is for example an IC chip clothed with moulding. In advance of the moulding process, the rear surface of lead frame of the IC chip is cleaned and coated with an antioxidation film made of silicon nitride in order to avoid the oxidation of the lead frame. The antioxidation film ensures the connection of the moulding and the lead frame and protect the IC chip from moisture invaded through cracks or gaps. The coating of silicon nitride is carried out after cleaning the lead frame.

4 Claims, 4 Drawing Sheets

ELECTRIC DEVICE UTILIZING ANTI-OXIDATION FILM BETWEEN BASE PAD FOR SEMICONDUCTOR CHIP AND ORGANIC ENCAPSULATING MATERIAL

This application is a continuation of Ser. No. 07/392,581, filed Aug. 11, 1989, now abandoned.

BACKGROUND OF THE INVENTION

The present invention relates to an electric device and manufacturing method of the same.

Integrated semiconductor circuits are most important electric devices which have been broadly used in a variety of fields. One of the problems from the view point of reliability is the flowing-in of moisture or other impurities into the IC chips embedded in molding resin. The flowing-in takes place through cracks or gaps which may occur in the molding to form paths from the outside of the molding to the surface of the IC chip. The moisture which reaches the IC surface causes undesirable destructive corrosion of the semiconductor constituting the IC chip and leads to malfunction of the chip operation.

FIG. 1 is an illustration showing how defects are formed in the packaged IC device. The structure comprises an IC semiconductor chip 28 mounted on a base frame 35', leads 37 with which the IC chip 28 is electrically coupled by means of Au wiring 39 and epoxy molding enclosing the IC chip and lead frames 35' and 37. The surface of the frame usually have been oxidized and formed suboxide films 24, 24' and 32 on the surface. In this structure, moisture tends to gather near the interface between the frame and the molding. When the IC device is arranged on an electrical circuit board, soldering is performed by dipping the IC device in a molten solder at 260° C. for 3 to 10 seconds. The rapid change in temperature often causes cracks in the molding as designated by 33 and 31. Also, the moisture trapped around the frames is evaporated and causes swelling 41' to form a cavity 42 by the force of the vapor pressure resulting in cracks 33'. This swelling is particularly likely since the oxide film 32 weakens the adhering power of the molding to the frame.

Particularly, suboxide films which might be formed on the rear surface of the lead frame in advance of molding inhibit the sturdy connection between the rear surface and the molding material and eventually produce the swelling 41'.

SUMMARY OF THE INVENTION

It is therefore an object of the present invention to provide a reliable electric device and manufacturing the same which is immune to moisture or other impurities invading through cracks or other paths of a package enclosing the device.

In order to accomplish the above and other advantages and objects, the rear surface of the lead frames are coated with antioxidation films of a thickness of 300 to 5000 Å in advance of the molding process of IC devices.

BRIEF DESCRIPTION OF THE DRAWING

This invention can be better understood from the following detailed description when read in conjunction with the drawing in which.

DETAILED DESCRIPTION OF THE PREFERRED EMBODIMENTS

Figure 2:
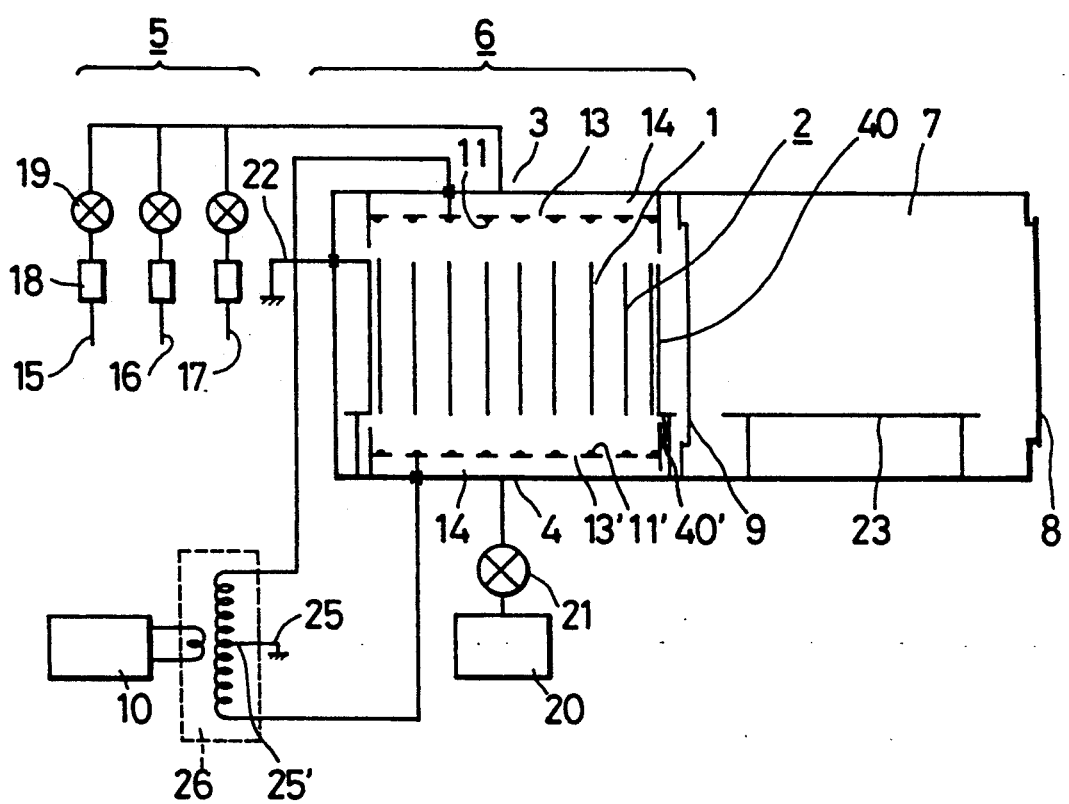
FIG. 2 is a schematic diagram showing a plasma CVD apparatus for use in embodying the present invention.

Referring now to FIGS. 2 and 3(A) to 3(C), a plasma processing method in accordance with an embodiment of the present invention is described. FIG. 2 is a schematic cross sectional diagram showing a plasma CVD apparatus. The apparatus comprises a deposition chamber 1, a loading-unloading chamber 7 coupled with the deposition chamber 1 through a gate valve 9, a pair of mesh or grid electrodes 11 and 14 provided in the deposition chamber 1, a gas feeding system 5, a vacuum pump 20 connected to the chamber 1 through a valve 21, and a high frequency power source 10 for supplying electric energy between the electrode 11 and 14 through a transformer 26. The mid point 25 of the secondary coil of the transformer 26 is grounded at 25. The gas feeding system includes three sets of flow rate meters 18 and valves 19. The high frequency energy inputted to the electrodes 11 and 14 causes positive column glow discharge therebetween. The glow discharge region (deposition region) is confined by a four-sided frame 40 in order to avoid undesirable deposition outside the region. The frame 40 is supported by a supporter 40' and may be a grounded metal frame or an insulating frame. Within the deposition region, a number of substrate assemblies 2 are supported by the frame 40 and disposed in parallel with intervals of 2 to 13 cm, e.g. 6 cm. A plurality of lead frame are mounted on each assembly 2.

Figure 3A:
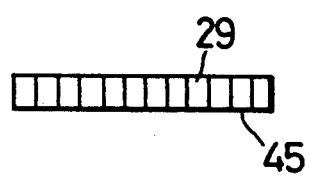
FIG. 3(A) is a schematic plan view showing the entirety of a lead frame structure for supporting IC devices in accordance with the present invention.
Figure 3B:
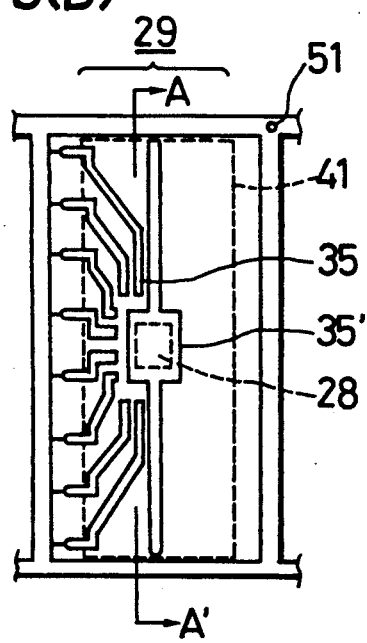
FIG. 3(B) is a partial expanded view of the unit structure of the lead frame illustrated in FIG. 2(A).
Figure 3C:
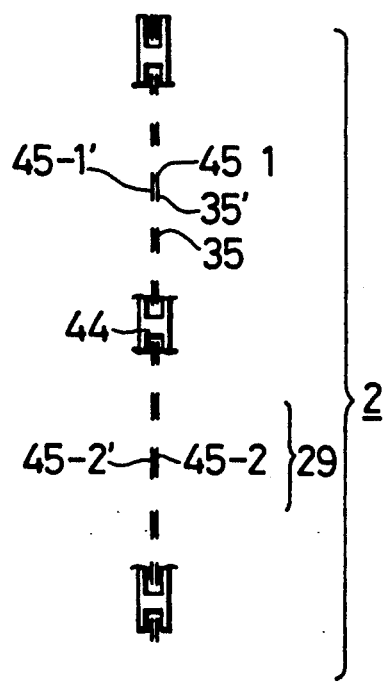
FIG. 3(C) is a partial cross sectional view taken along A—A line of FIG. 2(B).

The chip assembly is comprised of holding jigs 44 and lead frames 45 interposed and supported between the adjacent jigs 44 as illustrated in FIGS. 3(B) and 3(C). The surface of the center bases have been formed with rough surfaces in order to expedite the strength of connection between the frames and the molding which is to be formed in the following process. FIG. 3(B) shows a unit structure 41 of the lead frame corresponding to leads necessary for one chip, which unit structure is defined by broken line, but the illustration of the structure in the right side of the chip is omitted in the figure. The unit structure repeatedly appears along the frame between the upper and lower rails of the frame as shown in FIG. 3(A). One frame contains 5 to 25 unit structures, e.g. 12 units. A number of the jigs 44 are integrally assembled in order to accommodate 5 to 300 lengths of frames, e.g. 10 therebetween as shown in FIG. 3(C). In this figure, the frames are supported in grooves of the jigs 44. Alternatively, the frames can be suspended at holes 51 by pins (not shown) formed on the jigs. These frames are made from 42 alloy or cupper.

These frames are supported by the jigs 44 in face-to-face relationship in order that deposition takes place only on the rear surface of the frames.

Next, protective film coating process in accordance with the present invention will be explained. A number of lead frames are mounted on the assemblies 2. The assemblies are disposed in the deposition chamber at a constant interval through the loading-unloading chamber 7.

In advance of actual deposition, the external surfaces of the lead frames are cleaned. Particularly, suboxide films are removed from the surfaces. After evacuating the deposition chamber, Ar gas is leaked into the deposition chamber 1 at 0.01 to 1 Torr from the gas feeding system 5 through a nozzle 3. The Ar gas is then converted to its plasma state by inputting energy of 1 KW at 13.56 MHz in order to form glow discharge and carry out plasma cleaning for 10 to 30 minutes. By this cleaning, suboxide films formed on the surfaces of the lead frames are eliminated. Next, $NH_3$, $Si_2H_6$ and $N_2$ (carrier gas) are leaked through the nozzle 3 at 0.01 to 1 Torr into the deposition chamber 1 respectively from the introduction ports 15, 16 and 17 at appropriate pressures. The introduction molar ratio of $NH_3/Si_2H_6/N_2$ is 1/3/5. Positive column glow discharge takes place when high frequency energy is input to the pair of electrodes 11 and 14 at 1 KW and 1 to 500 MHz, e.g. 13.56 MHz. As a result, there is deposited silicon nitride coating, as an antioxidation film, on the rear surface of the lead frame. The thickness of the coating reaches to $1000 \pm 200$ angstroms by continuing the deposition for 10 minutes. The average deposition speed is about 3 angstrom/sec.

After completing the deposition, the assemblies are removed from the chamber and undergo chip mounting process. IC chips are mounted on the center base portions of the lead frames, which are designated by numeral 28 in FIG. 3(B). The electrical connection is made between the IC chips and the circumferential leads by use of Ag wiring. Each assembly is then placed on a molding apparatus as it is. An epoxy material (410A) is injected to an appropriate portion around each chip with suitable molds and form an external chip package. After removing the assembly from the molding apparatus, the IC's are separated from the frames by cutting the ends of the leads. Each lead, which extends beyond the molding structure, is then bended downwardly in order to form the legs of a "IC worm". The leads are cleaned by acid washing, followed by solder plating.

Figure 4:
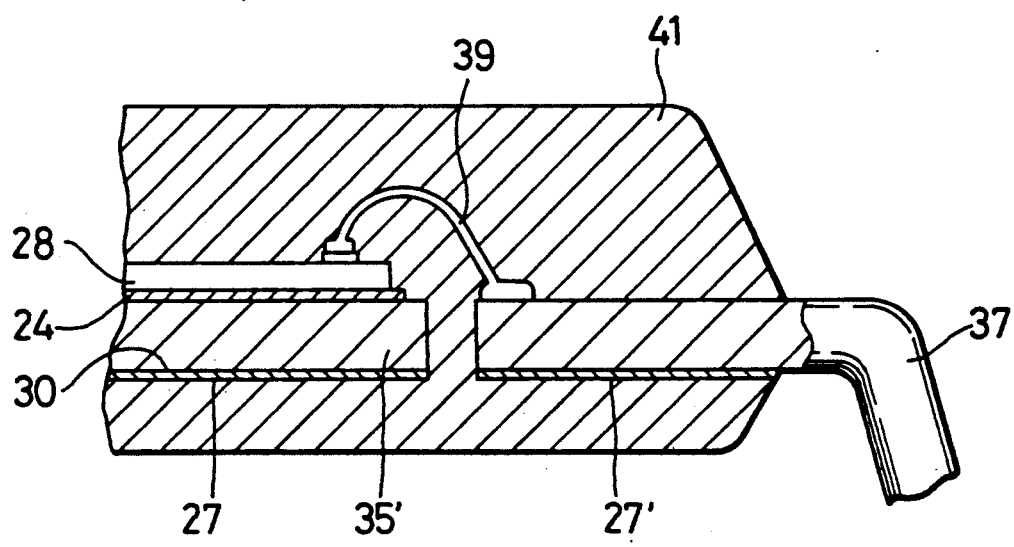
FIG. 4 is a partial cross section showing an IC device in accordance with the present invention.

The internal structure of the molding structure is illustrated in FIG. 4 in details. As shown in the figure, an IC chip 28 is mounted on a base 35' by means of Ag paste 24 and electrically coupled with the leads 37. The antioxidation films 27 and 27' of silicon nitride is covering the rear surfaces of the lead 35' and the base 35' made of 42 alloy. By virtue of the antioxidation films, it is avoided that the likelihood of separation of molding from the rear surface of the lead frames is increased by suboxide films which would, otherwise, be formed on the surface before the molding process. In accordance with experiments, the IR absorbing spectrum of the antioxidation films showed a peak at 864 $cm^{-1}$ which is indicative of Si-N bondings. The withstanding voltage level of the insulating coating was measured to be $8 \times 10^6$ V/cm. The resistivity of the coating is measured to be $2 \times 10^5$ ohm centimeter. The reflective index of the coating was measured to be 2.0.

Figure 1:
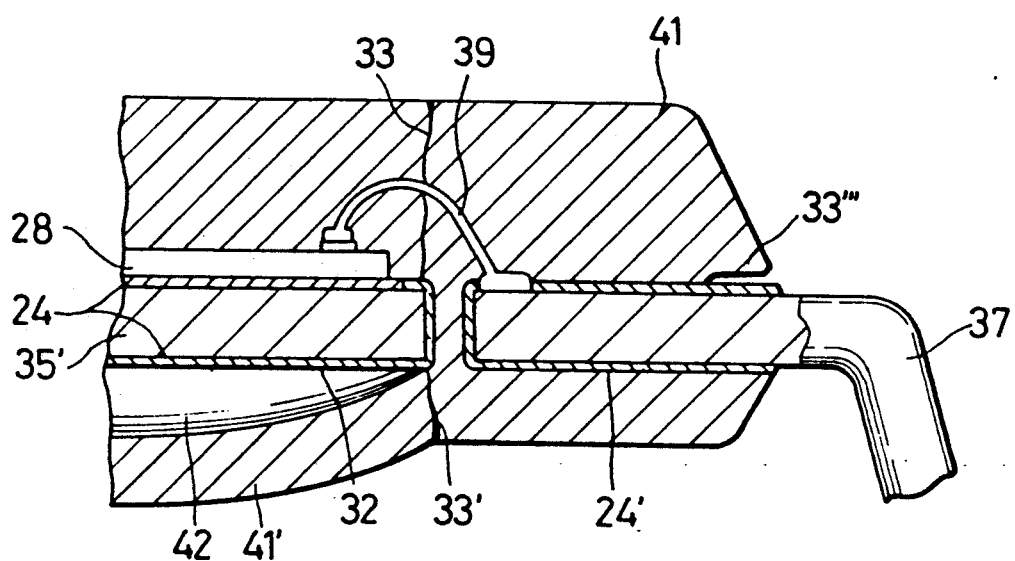
FIG. 1 is an explanatory cross section showing drawbacks of prior art devices.

After kept in an atmosphere of 85° C. and 85% (relative humidity) for 1000 hours, the IC devices were dipped in melting solder at 260° C. for 5 seconds in order to make electrical connection with circuits on a circuit board. However, no crack or no swelling appeared. 500 samples prepared without plasma cleaning and silicon nitride film coating were subjected to this test. As a result, 80 samples became inacceptible due to defects as illustrated in FIG. 1. 500 samples given the plasma cleaning treatment without silicon nitride film coating were subjected to this test. As a result, 3 samples became inacceptible due to corrosion at the alminium pads. Also, 500 sample given both the treatments of plasma cleaning and silicon nitride film coating were subjected to this test. As a result, no samples became inacceptible.

While several embodiments have been specifically described by way of examples, it is to be appreciated that the present invention is not limited to the particular examples described and that modifications and variations can be made without departing from the scope of the invention as defined by the appended claims. Some examples are as follow.

Diamond like carbon, silicon carbide or other insulating material can be deposited to form the antioxidation films. Although the embodiment was IC chips, the present invention can be applied to other electric devices, such as resistors and capacitors. Also, the present invention is effective in case utilizing other bonding methods such as flip chip bonding and solder bump bonding.

The plasma deposition or cleaning can be made more effective when the plasma is energized further by illumination of IR light rays having wavelengths of 10 to 15 micrometers or UV light rays having wavelengths no longer than 300 nanometers.

In the above embodiment, the lead frames are of the dual-in-line type. However, the present invention can be applied to other types of lead frames such as the flat pack type.

What is claimed is:

1. An electric device comprising:
   a lead frame consisting of at least one lead and a base pad;
   a semiconductor chip mounted on a surface of said base pad and electrically coupled with said lead; and
   an enclosure made of an organic material enclosing said lead frame and said semiconductor device mounted thereon,
   wherein an anti-oxidation film is formed at an interface between said base pad and said organic material.

2. The device of claim 1 wherein said antioxidation film is made of silicon nitride.

3. The device of claim 1 wherein said semiconductor chip is an IC chip.

4. The device of claim 2 where said silicon nitride film has a thickness of 300 to 5000 Å.

* * * * *